(12) United States Patent
Nakano

(10) Patent No.: US 8,321,829 B2
(45) Date of Patent: Nov. 27, 2012

(54) INTERCONNECTION DESIGN METHOD, RECORDING MEDIUM CONTAINING PROGRAM AND MANUFACTURING METHOD OF INTERCONNECTION SUBSTRATE

(75) Inventor: Mikio Nakano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 12/730,040

(22) Filed: Mar. 23, 2010

(65) Prior Publication Data

US 2011/0066266 A1 Mar. 17, 2011

(30) Foreign Application Priority Data

Sep. 16, 2009 (JP) ................................. 2009-214442

(51) Int. Cl.
*G06F 17/50* (2006.01)

(52) U.S. Cl. ........................................................ 716/126

(58) Field of Classification Search .................. 716/126, 716/136, 111, 118, 119
See application file for complete search history.

(56) References Cited

U.S. PATENT DOCUMENTS

2007/0130555 A1* 6/2007 Osaka .............................. 716/15
2010/0011326 A1* 1/2010 Sadamatsu ........................ 716/7

FOREIGN PATENT DOCUMENTS

JP 2009-081534 4/2009

OTHER PUBLICATIONS

MIS, 890GXM-G65 series, MS-7642(v1.x) Mainboard, Feb. 2010.*
Y. Tomioka et al., "Rountability Driven Modification Method of Monotonic Via Assignment for 2-layer Ball Grid Array Packages," Department of Communication and Integrated Systems, Tokyo Institute of Technology, 2008 IEEE, pp. 238-243.
Background Art Information.

* cited by examiner

*Primary Examiner* — Jack Chiang
*Assistant Examiner* — Brian Ngo
(74) *Attorney, Agent, or Firm* — Knobbe, Martens, Olson & Bear LLP

(57) ABSTRACT

An interconnection design method for a multiplayer interconnection substrate having a power supply layer or a ground layer, interconnection layers having interconnections, vias connecting the interconnection layers mutually, and an opening surrounding a via in the power supply layer or the ground layer, the method including: specifying an interconnection for a specific signal as a specific signal interconnection; determining an approximate arrangement of vias; changing positions of the vias and obtaining approximate interconnection routes in respective approximate arrangement of the vias, and evaluating respective interconnectivity for an evaluation region; and obtaining a detailed interconnection route based on a result of the evaluation of the interconnectivity; the specific signal interconnection including one adjacent to a via, and the evaluating respective interconnectivity includes setting a position of one end of the evaluation region into a position associated with an outside end face of the opening.

18 Claims, 9 Drawing Sheets

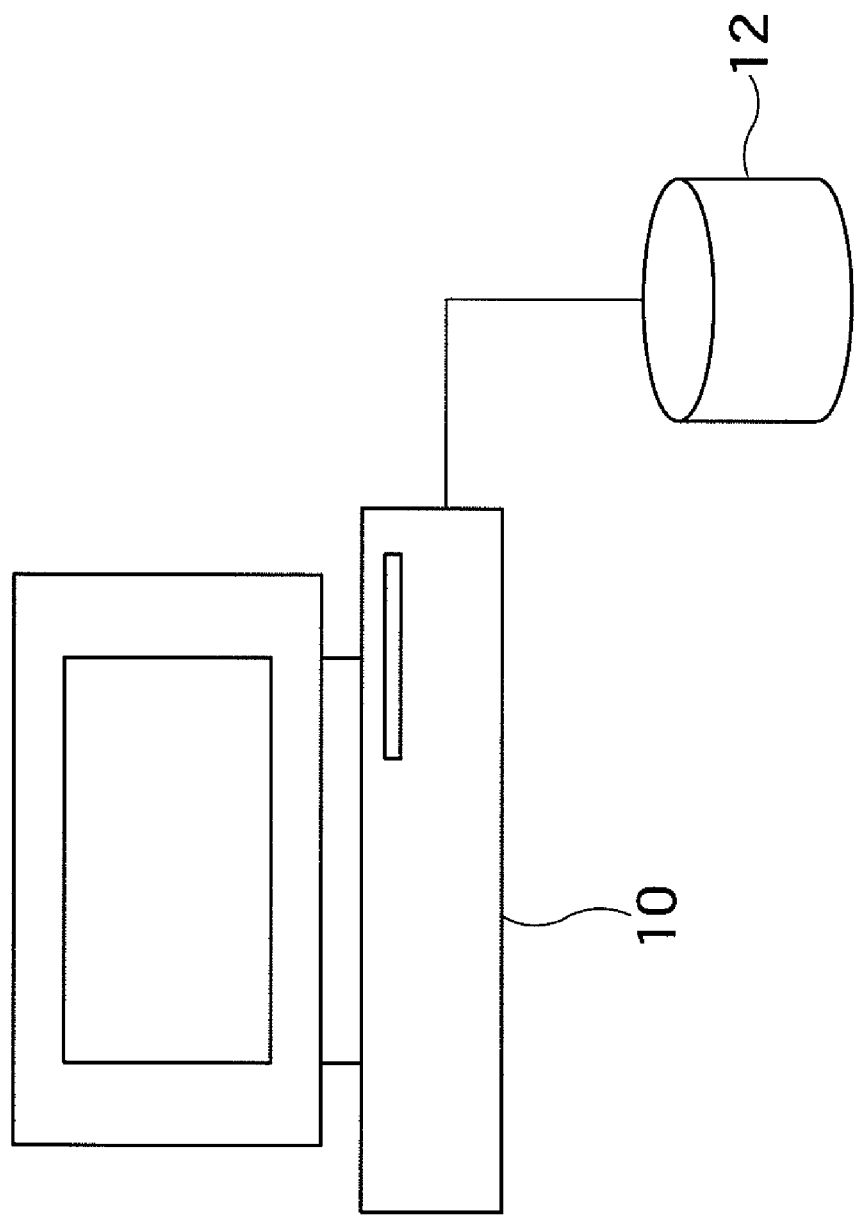

INTERCONNECTION DESIGN METHOD, RECORDING MEDIUM CONTAINING PROGRAM AND MANUFACTURING METHOD OF INTERCONNECTION SUBSTRATE

CROSS REFERENCE TO RELATED APPLICATION

This application claims benefit of priority under 35USC §119 to Japanese patent application No. 2009-214442, filed on Sep. 16, 2009, the contents of which are incorporated by reference herein.

BACKGROUND

Interconnectivity of a multiplayer interconnection substrate greatly depends upon positions of vias which connect interconnection layers mutually. When designing interconnections of a multilayer interconnection substrate, therefore, it is important to dispose vias in optimum positions as far as possible.

In many cases, as long as approximate positions of vias are determined, the approximate route of its interconnection is uniquely determined. Therefore, an interconnection process includes the following stages in general:

(1) a stage of finding approximate positions of vias and approximate interconnection routes; and (2) a stage of finding detailed interconnections When determining approximate positions of vias, approximate positions of vias are determined to lower the degree of congestion as far as possible and thereby increase the interconnectivity in the subsequent detailed interconnection process. In other words, positions of vias are determined in a manner that the number of interconnections passing between vias does not exceed the number of passable interconnections which depends on the design rule.

A technique for finding appropriate interconnections while improving the via positions is also proposed (for example, Yoichi Tomioka, Atsushi Takahashi, "Routability Driven Modification Method of Monotonic Via Assignment for 2-layer Ball Grid Array Packages", in Proceedings of the 2008 conference on Asia and South Pacific design automation, pp. 238-243, 2008).

If there is an interconnection for a high speed signal in an interconnection substrate having a power supply plane or a ground plane, then it is desirable that the power supply plane or the ground plane always passes right under the high speed signal interconnection in order to keep the characteristic impedance constant as far as possible (see, for example, Japanese Patent Laid-Open Pub. 2009-081534).

On the other hand, if signal interconnections are connected to each other via a via in an interconnection layer located above or below the power supply plane or the ground plane, an opening is provided through the power supply plane or the ground plane in order to insulate the via from the power supply plane or the ground plane (see FIG. 3B).

If a high speed signal line is interconnected in a position adjacent to the via, then the high speed signal passes over a hole formed through the power supply plane or the ground plane and it becomes difficult to keep the characteristic impedance constant.

For avoiding such a situation, it is necessary to make the interval between the via and the interconnection greater than an interval which is needed in a usual situation.

If all intervals between signal interconnections and vias are made large, however, then an interconnection area which is greater than needed is required and interconnectivity (degree of easiness of interconnection) remarkably falls.

It is ideal to make the interval between an interconnection and a via large only when a signal interconnection adjacent to the via is a high speed signal line. However, there has not been such an automatic interconnection technique until now.

SUMMARY

In accordance with a first aspect of the invention, there is provided an interconnection design method for a multiplayer interconnection substrate comprising a power supply layer or a ground layer, interconnection layers having interconnections, vias connecting the interconnection layers mutually, and an opening surround a via in the power supply layer or the ground layer, the interconnection design method comprising:

specifying an interconnection for a specific signal and define the specified interconnection as a specific signal interconnection;

determining an approximate arrangement of vias;

changing positions of the vias and obtaining approximate interconnection routes in respective approximate arrangement of the vias, and evaluating respective interconnectivity for an evaluation region; and obtaining a detailed interconnection route based on a result of the evaluation of the interconnectivity;

wherein the specific signal interconnection comprises one adjacent to a via, and the evaluating respective interconnectivity comprises setting a position of one end of the evaluation region comprising the specific signal interconnection adjacent to the via, into a position associated with an outside end face of the opening.

In accordance with a second aspect of the invention, there is provided a computer readable recording medium containing a program which cause a computer to execute an interconnection design for a multiplayer interconnection substrate comprising a power supply layer or a ground layer, interconnection layers having interconnections, vias connecting the interconnection layers mutually, and an opening surround a via in the power supply layer or the ground layer, the interconnection design comprising:

specifying an interconnection for a specific signal and define the specified interconnection as a specific signal interconnection;

determining an approximate arrangement of vias;

changing positions of the vias and obtaining approximate interconnection routes in respective approximate arrangement of the vias, and evaluating respective interconnectivity for an evaluation region; and obtaining a detailed interconnection route based on a result of the evaluation of the interconnectivity, wherein the specific signal interconnection comprises one adjacent to a via, and the evaluating respective interconnectivity comprises setting a position of one end of the evaluation region comprising the specific signal interconnection adjacent to the via, into a position associated with an outside end face of the opening.

In accordance with a third aspect of the invention, there is provided a manufacturing method of a multiplayer interconnection substrate comprising a power supply layer or a ground layer, interconnection layers having interconnections, vias connecting the interconnection layers mutually, and an opening surround a via in the power supply layer or the ground layer, the method comprising:

specifying an interconnection for a specific signal and define the specified interconnection as a specific signal interconnection;

determining an approximate arrangement of vias;

changing positions of the vias and obtaining approximate interconnection routes in respective approximate arrangement of the vias, and evaluating respective interconnectivity for an evaluation region;

obtaining a detailed interconnection route based on a result of the evaluation of the interconnectivity;

producing a mask according to the obtained detailed interconnection route; and manufacturing a multilayer interconnection substrate using the produced mask;

wherein the specific signal interconnection comprises one adjacent to a via, and the evaluating respective interconnectivity comprises setting a position of one end of the evaluation region comprising the specific signal interconnection adjacent to the via, into a position associated with an outside end face of the opening.

BRIEF DESCRIPTION OF THE DRAWINGS

In the attached drawings:

FIG. 4 shows a computer for executing an interconnection design method according to a first embodiment of the invention;

DETAILED DESCRIPTION

Hereafter, some embodiments according to the present invention will be described more specifically with reference to the drawings. In the ensuing description, automatic interconnection for a package substrate is taken as an example. However, the present invention is never limited to this example, but the present invention can be generally applied to any multilayer interconnection substrate including the power supply/ground plane which has openings to insulate vias from the power supply/ground plane. In the accompanying drawings, the same parts are denoted by like characters, and duplicated description will be conducted only in the case where needed.

(1) First Embodiment

Figure 1:
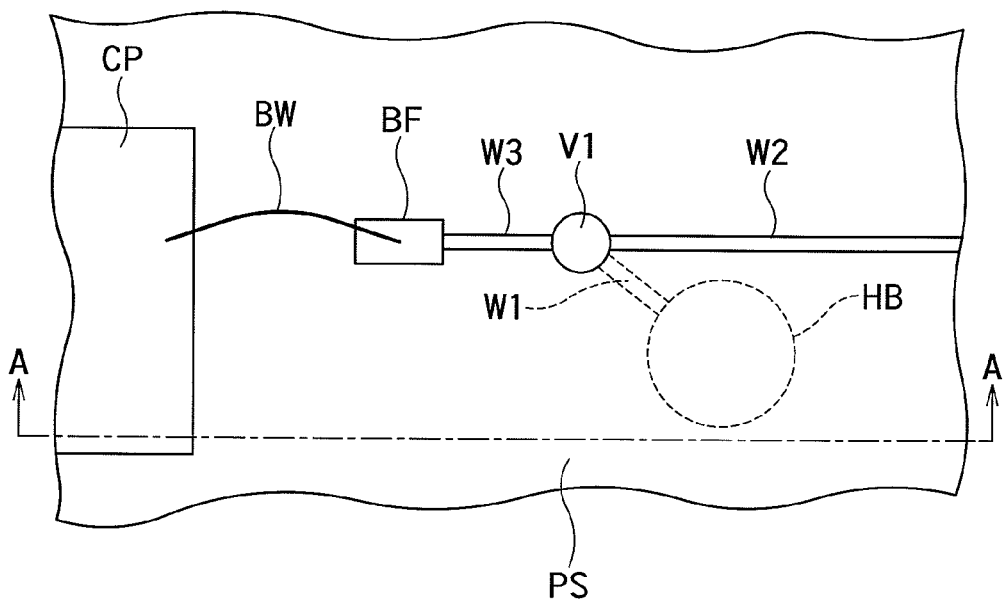
FIG. 1 is a top view showing a principal part of a semiconductor package to which an interconnection design method according to a first embodiment of the present invention is applied.
Figure 2:
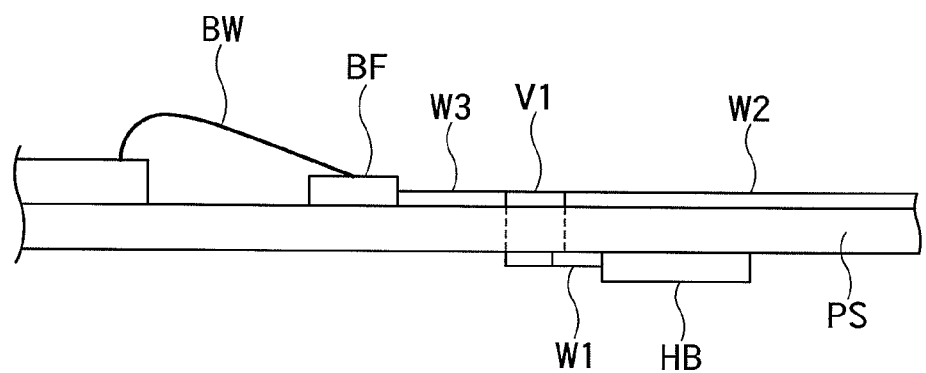
FIG. 2 is a sectional view taken along an A-A line in FIG. 1.

FIG. 1 is a top view showing a principal part of a semiconductor package to which an interconnection design method according to a first embodiment of the present invention is applied. FIG. 2 is a sectional view taken along an A-A line in FIG. 1.

A semiconductor chip CP is mounted on a main surface of a substrate PS. Interconnections W2 and W3 are formed on the main surface of the substrate PS in close vicinity to the semiconductor chip CP, and the interconnection W3 is connected to a bonding finger BF. The bonding finger BF is connected to an external terminal of the semiconductor chip CP through a bonding wire BW. At a connection node between the interconnections W2 and W3, a via V1 is formed so as to pass through the substrate PS. The via V1 is connected to a solder ball HB via a back interconnection W1 on the rear surface of the substrate PS.

Figure 3B:
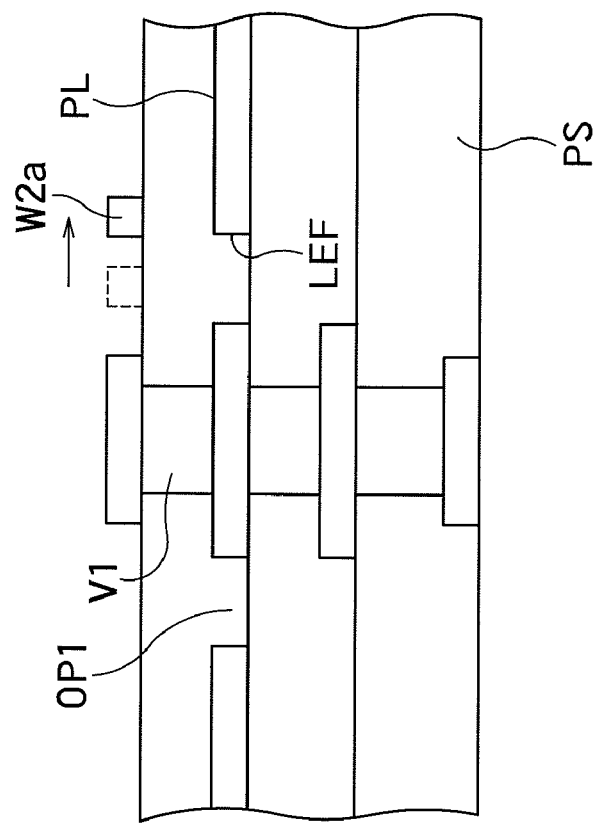
FIGS. 3A and 3B are views explaining that a specific signal interconnection is required so as to avoid an opening when a power supply/ground plane is provided with the opening.
Figure 3A:
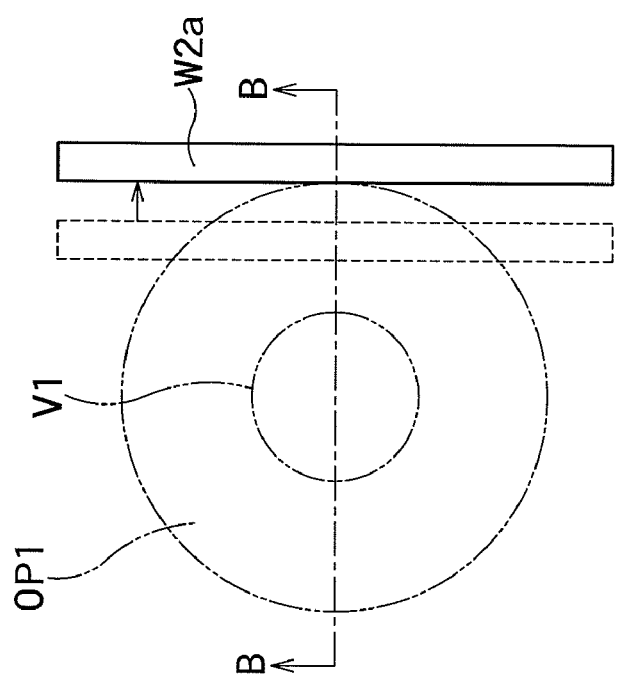

If the substrate PS has a multilayer interconnection structure and includes a power supply/ground plane PL as shown in FIGS. 3A and 3B, then an opening OP1 is provided through the power supply/ground plane PL so as to surround the via V1. If an interconnection W2a is an interconnection for passing a specific signal, for example, a high speed signal, then it is necessary to provide the interconnection W2a so as to avoid the opening OP1 by shifting the interconnection W2a from a position over the opening OP indicated by a dashed line in FIGS. 3A and 3B to a position indicated by a solid line in order to retain characteristic impedance. By the way, FIG. 3B is a sectional view taken along a line B-B in FIG. 3A.

FIG. 4 shows a computer 10 for executing the interconnection design method according to the present embodiment. An exterior type hard disk apparatus 12 is connected to a computer 10. A recipe file which describes procedures of interconnection design described in detail hereafter is stored in the exterior type hard disk apparatus 12. The computer 10 reads the recipe file from the hard disk apparatus 12 and conducts interconnection design. Incidentally, the recording medium is not restricted to a stationary type recording medium such as the hard disk apparatus 12 or a memory, but a portable medium such as a magnetic disk or an optical disk may also be used.

Figure 5:
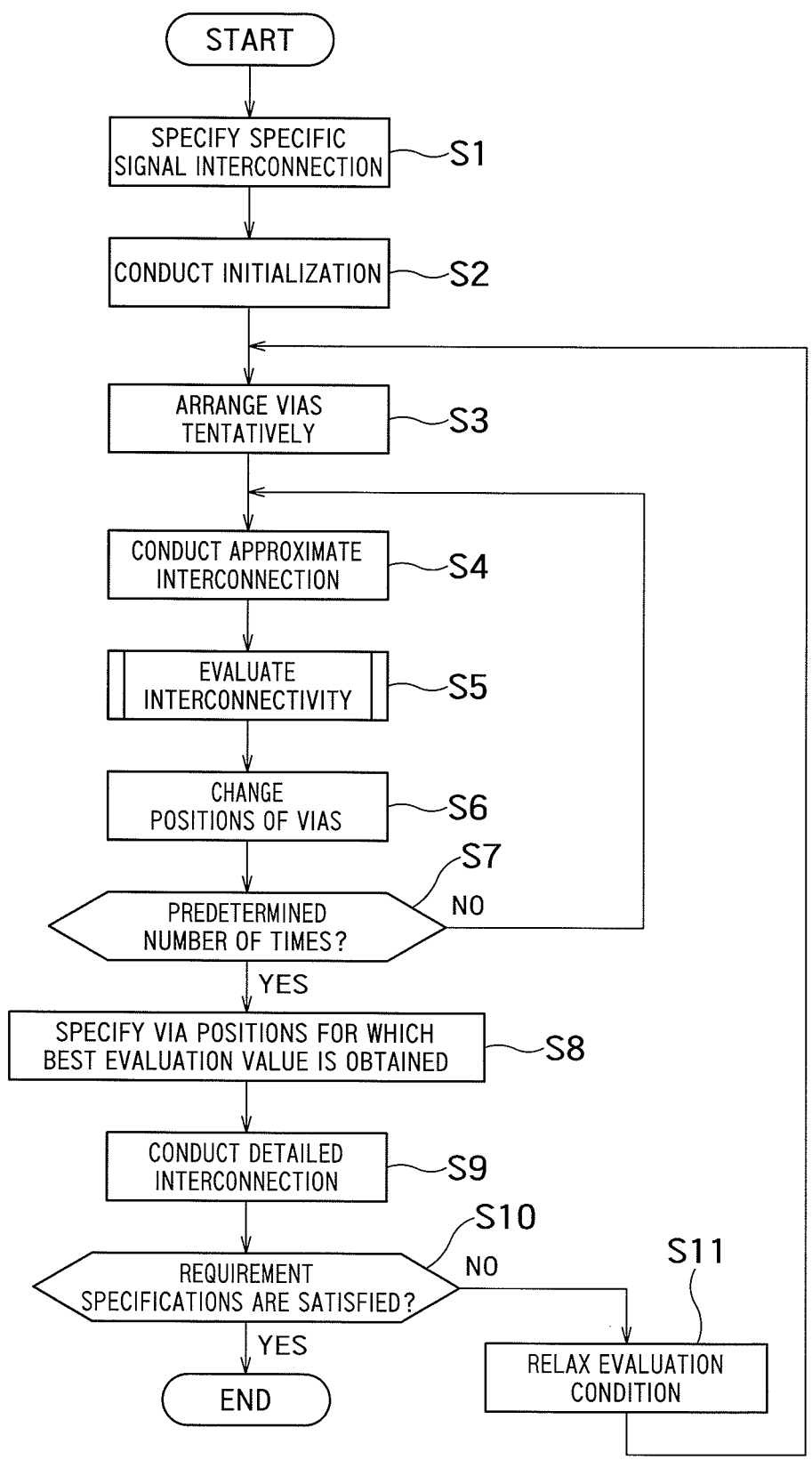
FIG. 5 is a flowchart showing schematic processes of the interconnection design method according to the first embodiment of the invention.

FIG. 5 is a flow chart showing schematic processes of the interconnection design method according to the present embodiment. As described below, one of the characteristic features of the present embodiment lies in processes at steps S1 and S5. Specifically, when a specific signal interconnection is adjacent to a via, an evaluation area of interconnectivity is changed from an area "between vias" in the conventional art into an area "between an end of a first via opposed to a first end surface of a first opening of the power supply/ground plane, and an outside surface of a second openings of the power supply/ground plane." Hereafter, it will be described in sequence.

First, a specific signal interconnection is specified out of object interconnections (step S1). The "specific signal interconnection" refers to a signal interconnection subjected to an influence of the characteristic impedance when disposed in an overlying layer or an underlying layer of an opening of the power supply/ground plane. A typical example is an interconnection for a high speed signal. As an example of such a high speed signal, a signal for DDR3, a signal for serial ATA, and a signal for USB 3.0 can be mentioned. Specification of the specific signal interconnection is executed by an operator.

Then, initialization for automatic interconnection is conducted (step S2). As for items in the initialization, parameters of an evaluation function, the number of times of change of the approximate arrangement of vias, requirement specifications of the product and so forth can be mentioned, besides a space Svw required between an interconnection and a via, a space Sww required between interconnections, and an interconnection width Ww (see FIG. 7) which are defined as design rules.

Then, the approximate arrangement of vias is determined tentatively under the above-described setting (step S3). Approximate interconnection is conducted by determining an approximate interconnection route according to the tentative via arrangement (step S4).

When determining the approximate position of the vias, it is conducted so as to make the interconnection density small as far as possible in order to improve the interconnectivity in subsequent detailed interconnection processes. More specifically, positions of vias are determined so as to prevent interconnections passing between vias from exceeding the number of interconnections determined by the design rule.

Then, evaluation of interconnectivity on the tentative approximate interconnection route is conducted (step S5), and a value of an evaluation function is output.

Then, the approximate positions of vias are changed (step S6). The approximate interconnection (step S4) and the interconnectivity evaluation (step S5) are conducted again in the changed positions of vias. These processes are repeated by the number of times determined in the initialization (step S7). The value of the evaluation function at each time is recorded in recording means which is not shown.

Then, a via arrangement for which the best evaluation value is obtained from among a plurality of obtained evaluation functions is specified (step S8). Detailed interconnection routes are obtained based on the via arrangement (step S9).

Finally, a simulation is executed by using the obtained detailed interconnection route, and a determination is made whether requirement specifications of the product are satisfied (step S10). If the requirement specifications are satisfied, a mask is produced according to the via arrangement specified at the step S8 and the detailed interconnection routes obtained at the step S9. If the requirement specifications are not satisfied, the evaluation condition is relaxed (step S11), and the processes ranging from the tentative via arrangement to the detailed interconnection (the steps S3 to S9) are repeated until a solution which makes interconnection possible is obtained. A specific example of the evaluation condition relaxation will be described in second and third embodiments described below.

The process at the step S5 in FIG. 5 will now be described in more detail with reference to FIGS. 6 to 9.

Figure 6:
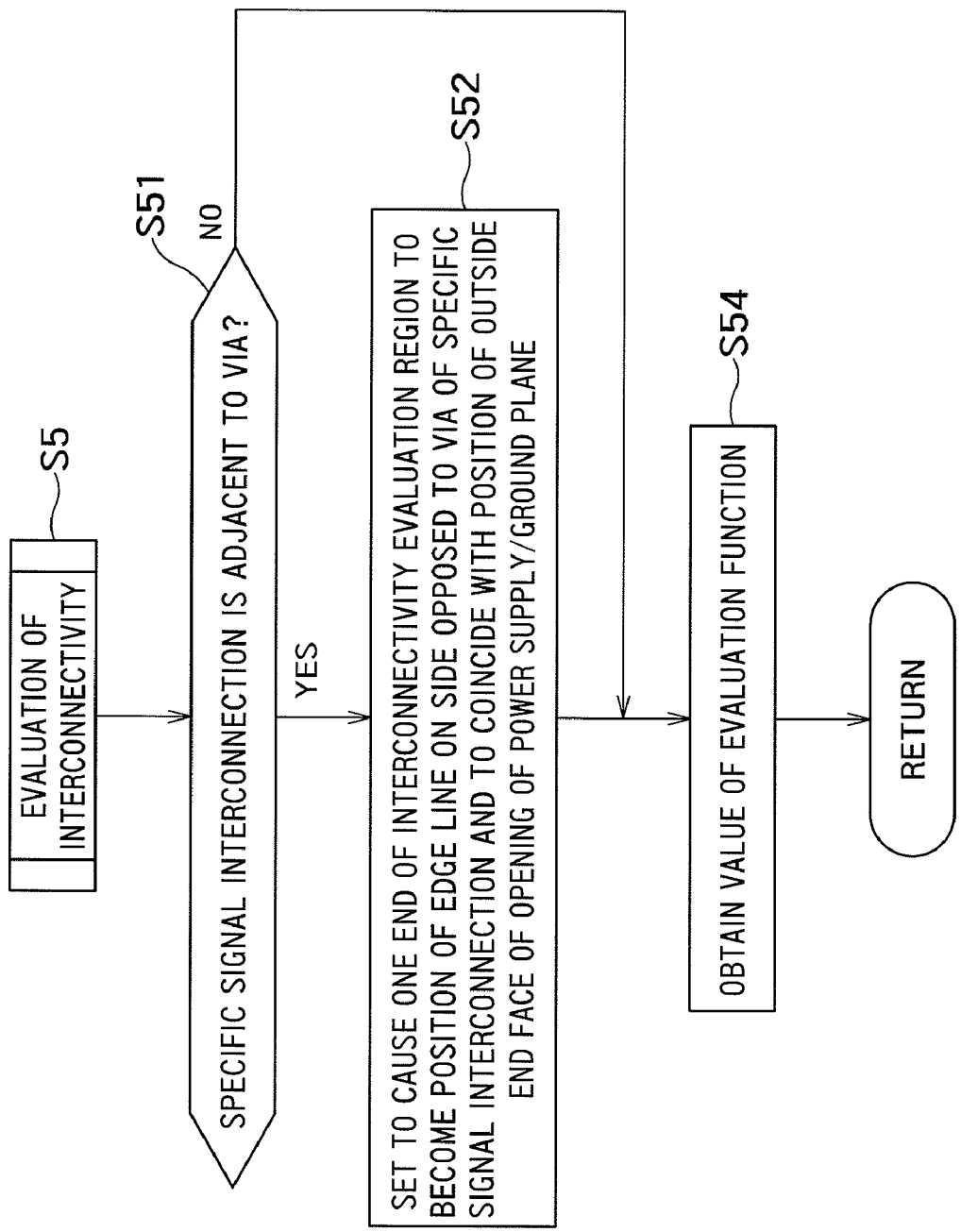
FIG. 6 is a flow chart showing specific processes of interconnectivity evaluation in FIG. 5.

FIG. 6 is a flow chart showing specific processes of interconnectivity evaluation in FIG. 5.

First, when a specific interconnection is specified in the process at the step S1 in FIG. 5, a determination is made whether the specific interconnection is adjacent to any via (step S51). If a specific interconnection adjacent to a via does not exist, then the value of the evaluation function is obtained according to the conventional art and recorded in recording means which is not shown (step S54).

If a specific interconnection adjacent to a via exists, then an evaluation region is changed to cause one end of the interconnectivity evaluation region to become a position of an edge line opposed to a via among edge lines of a specific signal interconnection and come in contact with an outside end face of an opening of the power supply/ground plane (step S52). A value of the evaluation function is found for the changed evaluation region (step S54). Then, the processing proceeds to the process at the step S6 in FIG. 5.

Figure 7:
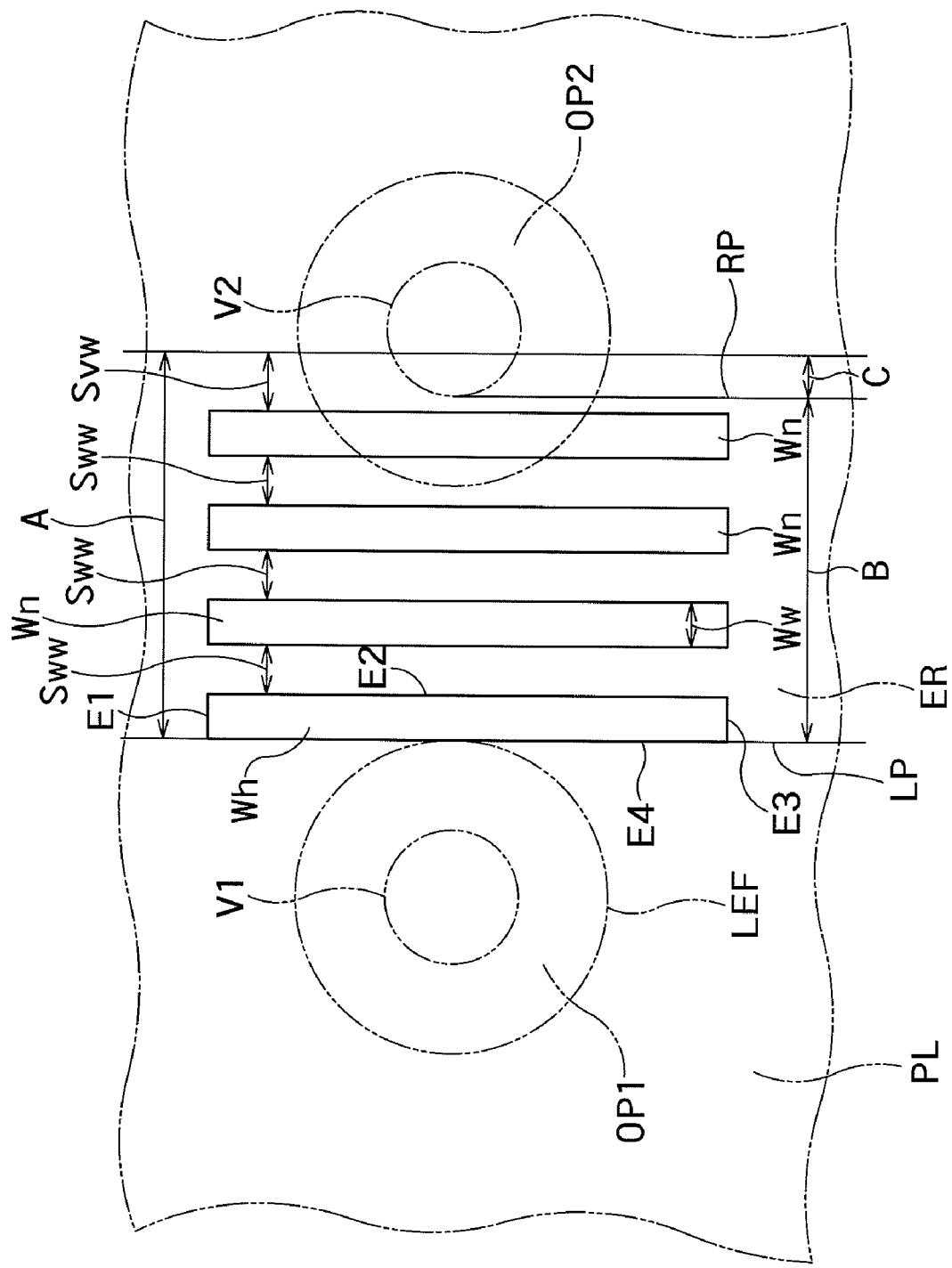
FIGS. 7 and 8 are explanatory drawings for processes shown in FIG. 6.
Figure 8:
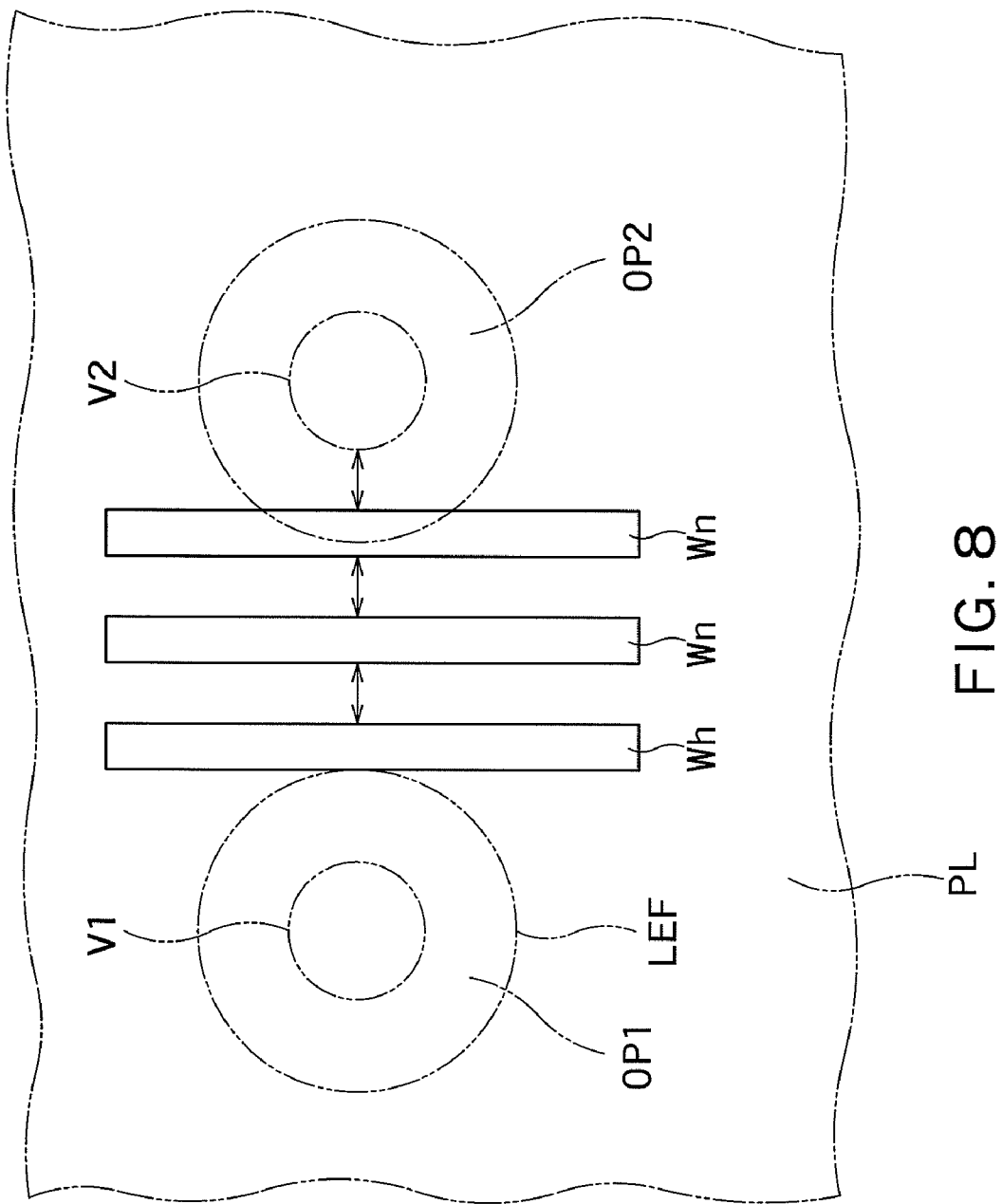

The interconnectivity evaluation process will be described more specifically with reference to FIGS. 7 and 8. In the example shown in FIG. 7, the number of interconnections passing between vias V1 and V2 is determined to be four by approximate interconnection. Among four interconnections shown in FIG. 7, three signal interconnections Wn are associated with the normal speed whereas a signal interconnection located on the left side of the sheet paper is specified as a high speed signal interconnection. In the example shown in FIG. 7, a right end RP of an object region ER of interconnectivity evaluation is set to be in contact with a side face of the via V2. However, the high speed signal interconnection Wh is adjacent to the via V1. Therefore, a left end LP of the evaluation region ER does not coincide with a right side tangential line of the via V1, but is set to be in a position of an edge line E4, which is included in edge lines E1 to E4 of the high speed signal interconnection Wh. Furthermore, the edge line E4 is located on a side opposed to the via V1, and be in contact with an outside end face LEF of the opening OP1 of the power supply/ground plane PL. In the present embodiment, a position in which the left end LP of the evaluation region ER is in contact with the outside end face LEF of the opening OP1 of the power supply/ground plane PL corresponds to, for example, "a position associated with the outside end face of the opening provided in the power supply layer or the ground layer to surround the via."

Evaluation is conducted to determine whether the four signal lines can be interconnected easily between the outside side face of the opening OP1 and the side face of the via V2 in the evaluation region ER which is set in this way. A distance indicated by a character A is needed to arrange the high speed signal line Wh and the three normal-speed signal lines Wn which are parallel to the high speed signal line Wh, because of a space Svw required between an interconnection and a via, a space Sww required between interconnections, and an interconnection width Ww, which are defined as the design rule. However, there remains only a distance, indicated by a character B, between the actual opening OP1 and a side face of the via V2. It is thus insufficient by an interval indicated by a character C (=A−B). Therefore, in the initialization at the step S2 shown in FIG. 5, parameters of the evaluation function are preliminarily set in a manner that the greater the value of the interval C becomes, the lower the value of evaluation becomes.

Approximate positions of vias have been found by using the evaluation function set in this way. As a result, it has been elucidated that the requirement specifications of the product are satisfied by a via arrangement in which two normal-speed signal lines Wn are arranged besides the high speed signal line Wh, between the vias V1 and V2 as shown in FIG. 8.

Figure 9:
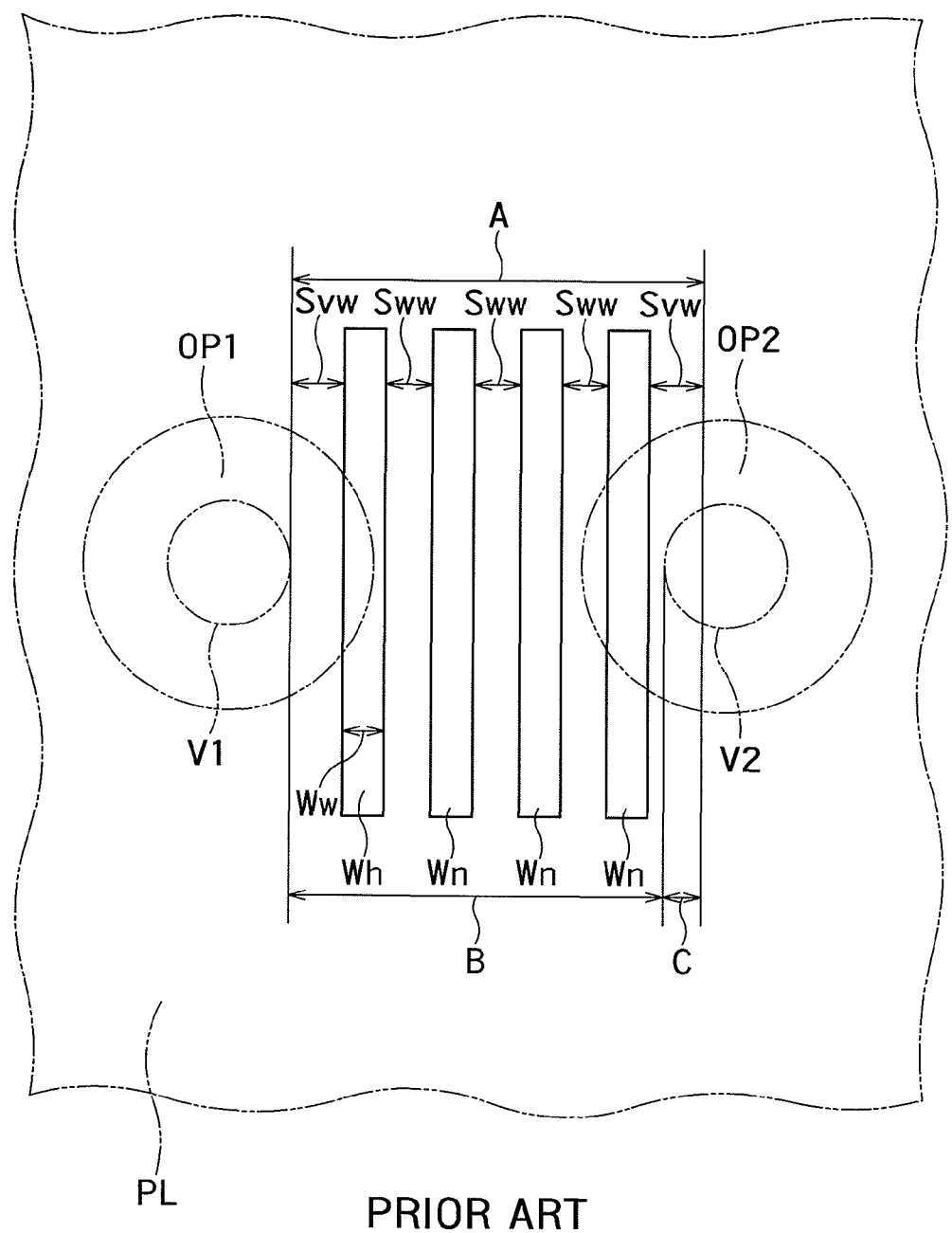
FIG. 9 is an explanatory drawing for a conventional technique.

FIG. 9 shows a result obtained by conducting automatic interconnection according to the conventional art, as a comparative example. According to the example shown in FIG. 9, a part of the high speed signal line Wh passes over the opening OP1 of the power supply/ground plane PL in the vicinity of the via V1. As a result, the characteristic impedance changes and consequently there is a possibility that the requirement specifications of the product will not be satisfied.

On the other hand, according to the present embodiment, the interconnectivity can be evaluated under the condition that the specific signal interconnection Wh does not pass over or under the opening OP of the power supply/ground plane PL. Therefore, it is possible to suppress the change of the characteristic impedance of the high speed signal while suppressing the lowering of the interconnectivity to the minimum.

(2) Second Embodiment

According to the first embodiment described above, spacing between the via V1 and the high speed signal interconnection Wh adjacent to the via V1 becomes greater than the spacing in the conventional art. Therefore, a greater interconnection area than that in the conventional art is needed. Even if interconnection is possible in the conventional art, therefore, the interconnection becomes impossible according to the above-described embodiment in some cases. The present embodiment provides a method capable of coping with such a situation.

Figure 10:
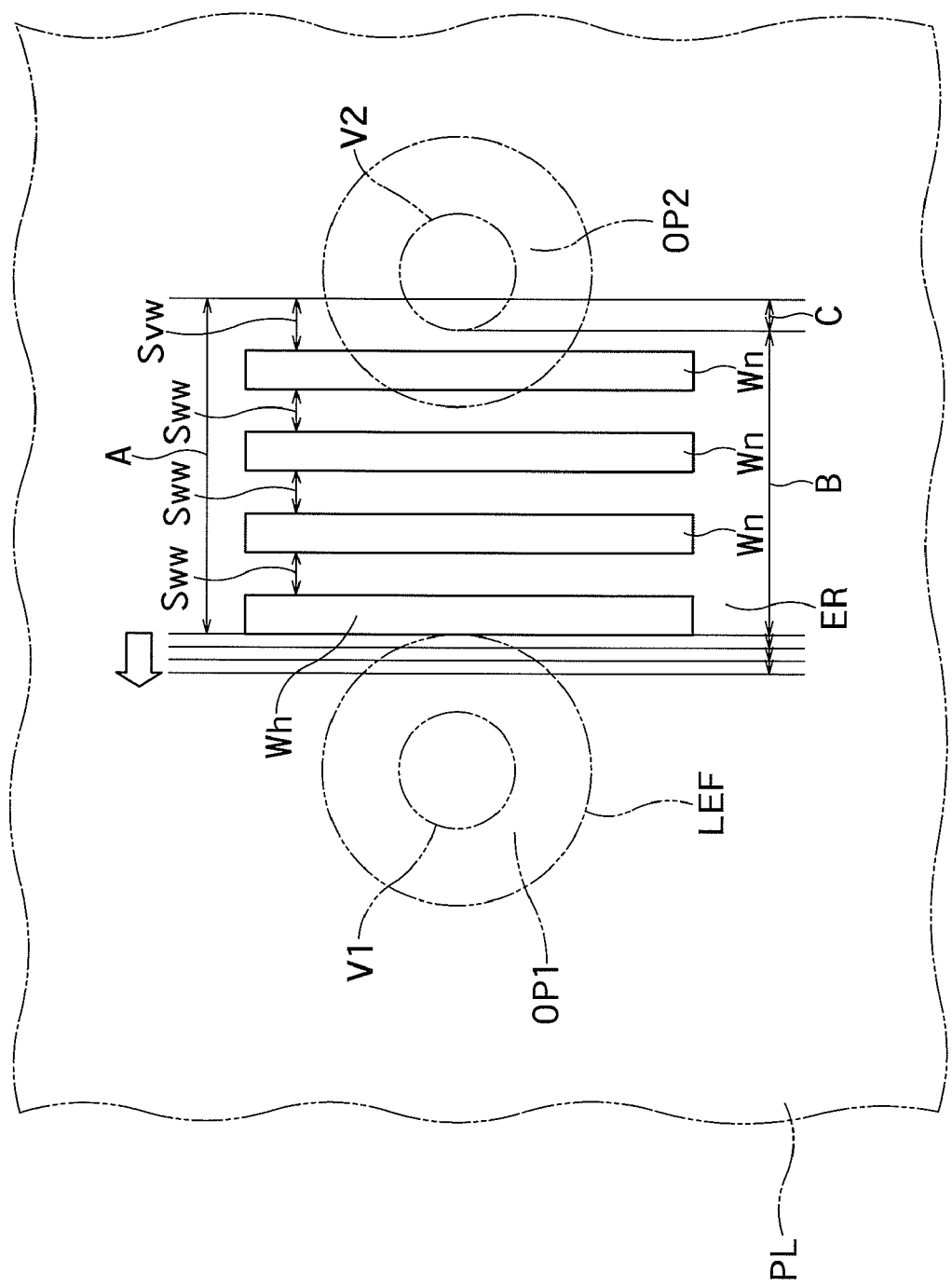
FIG. 10 is an explanatory drawing for an interconnection design method according to a second embodiment of the invention.

In the first embodiment, the left end LP of the evaluation region ER is set to be in a position of the edge line E4, which is included in the edge lines E1 to E4 of the specific signal interconnection Wh and opposed to the via V1, and be in contact with the outside end face LEF of the opening OP1 of the power supply/ground plane PL. If the interconnection becomes impossible according to such an interconnectivity evaluation process, a solution which makes interconnection possible is searched while shifting the position of the specific signal interconnection Wh over the opening OP1 little by little toward the via V1 in a direction of an arrow as shown in FIG. 10. The specific increment of the shift quantity may be set in the process of the evaluation condition relaxation (step S11) shown in FIG. 5.

In the case where interconnection which is impossible under the condition that the high speed signal interconnection Wh is not permitted to pass over or under the opening OP of the power supply/ground plane PL is made possible by permitting the interconnection to pass over the opening a little, the present embodiment makes it possible to find such a solution in this way.

(3) Third Embodiment

In the second embodiment, a solution which makes interconnection possible is obtained while relaxing the condition that the high speed signal interconnection Wh is not permitted to pass over or under the opening OP of the power supply/ground plane PL, little by little. The high speed signal is not restricted to a signal in which the characteristic impedance needs to be kept constant as far as possible, but may be a signal in which there is no problem even if the characteristic impedance changes to some extent. In this way, in some cases there is a difference in importance of the high speed signal even in the same product.

In the present embodiment, a difference is provided between high speed signal lines so as to cause the quantity of shift of the position of the specific signal interconnection Wh on the opening OP1 toward the via V1 in the second embodiment shown in, for example, FIG. 10 becomes greater as the importance of the passed signal becomes lower. More specifically, the signal interconnections may be previously provided with weights depending upon importance of the specific signal passing the signal interconnections, in the stage of the initialization (the step S2 in FIG. 5). Furthermore, the shift quantities may be set according to the weights respectively of the high speed signal interconnections in the process of the evaluation condition relaxation (step S11) shown in FIG. 5.

According to the present embodiment, it becomes possible to suppress the change of the characteristic impedance of a high speed signal having relatively high importance lower than that of a high speed signal having relatively low importance.

(4) Manufacturing Method of Interconnection Substrate

There is provided an interconnection substrate in which lowering of interconnectivity is suppressed to the minimum and the change of the characteristic impedance of the signal is suppressed by producing a mask according to the detailed interconnection route obtained using the interconnection design method and by manufacturing a multilayer interconnection substrate through processes such as pattern transfer.

(5) Rest

Heretofore, some embodiments of the present invention have been described. However, the present invention is never restricted to the above-described embodiments, and it is a matter of course that the present invention can be applied with various changes within the scope thereof. For example, in the embodiments, the case where the signal line at the left end among four signal lines which can be interconnected on the design rule is the specific signal interconnection has been described. However, the present invention is never restricted to such embodiments. For example, if the signal line at the right end among four signal lines is the specific signal interconnection, the right end of the evaluation region is not set so as to be in contact with the side face of the via V2. It is set to become a position of an edge line opposed to the via V2 among edge lines of the specific signal interconnection and come in contact with an outside end face of an opening OP2 of the power supply/ground plane.

What is claimed is:

1. An interconnection design method for a multilayer interconnection substrate comprising a power supply layer or a ground layer, interconnection layers comprising interconnections, and vias connecting the interconnection layers mutually, the interconnection design method comprising:
   selecting an interconnection for a predetermined signal by a computer;
   determining an approximate arrangement of vias by a computer, the vias comprising a first via through an opening provided in the power supply layer or the ground layer, the first via conducting signals;
   changing positions of the vias and obtaining approximate interconnection routes in respective approximate arrangement of the vias, defining an evaluation region comprising an interconnection, and evaluating respective interconnectivity of the evaluation region by a computer; and
   obtaining a detailed interconnection route based on a result of the evaluation of the interconnectivity by a computer;
   wherein the interconnections comprise the selected interconnection between adjacent first vias,
   the defining the evaluation region comprises setting a position of a side of the evaluation region so as to correspond to a position of an edge of the selected interconnection, and further comprises setting the position of the side of the evaluation region into a position associated with an edge of the opening, and
   the interconnectivity of the evaluation region is evaluated based on the number of interconnections between the vias and the number of possible interconnections determined based on a design rule.

2. The method of claim 1, wherein the position of the side of the evaluation region of interconnectivities corresponds with the edge of the opening.

3. The method of claim 1, wherein the detailed interconnection route is determined based on a via arrangement comprising a best evaluation value of the interconnectivity.

4. The method of claim 1, further comprising:
   executing a signal integrity analysis for the selected signal interconnection using the obtained detailed interconnection route and determining whether predetermined specifications of a product are satisfied;
   relaxing an evaluation condition, finding a further approximate interconnection route for each approximate position of the vias, evaluating interconnectivity of the found interconnection route and obtaining the detailed interconnection based on evaluation result of the interconnectivity are repeated, until predetermined conditions of interconnection are satisfied.

5. The method of claim 1, wherein the evaluating respective interconnectivity further comprises shifting the position of the selected interconnection toward the first via until the predetermined conditions of the interconnection are satisfied.

6. The method of claim 5, wherein an amount of the shift is adjusted according to an extent of importance of the selected interconnection.

7. The method of claim 1, wherein the predetermined signal comprises a high speed signal.

8. The method of claim 1, wherein the predetermined signal comprises a signal for double-data-rate three (DDR3), a signal for serial AT attachment (ATA), and a signal for Universal Serial Bus (USB) 3.0.

9. A non-transitory computer readable recording medium containing a program for an interconnection design for a multilayer interconnection substrate comprising a power supply layer or a ground layer, interconnection layers having interconnections, and vias connecting the interconnection layers mutually, that when executed by the one or more processors, causes the one or more processors to:
 select an interconnection for a predetermined signal;
 determine an approximate arrangement of vias, the vias comprising a first via through an opening provided in the power supply layer or the ground layer, the first via conducting signals;
 change positions of the vias and obtain approximate interconnection routes in respective approximate arrangement of the vias, define an evaluation region comprising an interconnection, and evaluate respective interconnectivity of the evaluation region; and
 obtain a detailed interconnection route based on a result of the evaluation of the interconnectivity,
 wherein the interconnections comprise the selected interconnection between adjacent first vias,
 the defining the evaluation region comprises setting a position of a side of the evaluation region so as to correspond to a position of an edge of the selected interconnection, and further comprises setting the position of the side of the evaluation region into a position associated with an edge of the opening, and
 the interconnectivity of the evaluation region is evaluated based on the number of interconnections between the vias and the number of possible interconnections determined based on a design rule.

10. The medium of claim 9, wherein the position of the side of the evaluation region of interconnectivities corresponds with the edge of the opening.

11. The medium of claim 9, wherein the detailed interconnection route is determined based on a via arrangement comprising a best evaluation value of the interconnectivity.

12. The medium of claim 9, wherein the program is additionally configured to cause the one or more processors to:
 execute a signal integrity analysis for the specific signal interconnection using the obtained detailed interconnection route and determine whether requirement specifications of a product are satisfied;
 relax an evaluation condition, find a further approximate interconnection route for each approximate position of the vias, evaluate interconnectivity of the found interconnection route and obtain the detailed interconnection based on evaluation result of the interconnectivity are repeated, until predetermined conditions of interconnection are satisfied.

13. The medium of claim 9, wherein the program is additionally configured to cause the one or more processors to shift the position of the selected interconnection toward the first via until the predetermined conditions of the interconnection are satisfied.

14. The medium of claim 13, wherein an amount of the shift is adjusted according to an extent of importance of the selected interconnection.

15. The medium of claim 9, wherein the predetermined signal comprises a high speed signal.

16. The medium of claim 9, wherein the predetermined signal comprises a signal for DDR3, a signal for serial ATA, and a signal for USB 3.0.

17. A manufacturing method of a multilayer interconnection substrate comprising a power supply layer or a ground layer, interconnection layers comprising interconnections, and vias connecting the interconnection layers mutually, the method comprising:
 selecting an interconnection for a specific signal by a computer;
 determining an approximate arrangement of vias by a computer, the vias comprising a first via through an opening provided in the power supply layer or the ground layer, the first via conducting signals;
 changing positions of the vias and obtaining approximate interconnection routes in respective approximate arrangement of the vias, defining an evaluation region comprising an interconnection, and evaluating respective interconnectivity of the evaluation region by a computer;
 obtaining a detailed interconnection route based on a result of the evaluation of the interconnectivity by a computer;
 producing a mask according to the obtained detailed interconnection route; and
 manufacturing a multiplayer interconnection substrate using the produced mask;
 wherein the interconnections comprise the selected interconnection between adjacent first vias,
 the defining the evaluation region comprises setting a position of a side of the evaluation region so as to correspond to a position of an edge of the selected interconnection, and further comprises setting the position of the side of the evaluation region into a position associated with an edge of the opening, and
 the interconnectivity of the evaluation region is evaluated based on the number of interconnections between the vias and the number of possible interconnections determined based on a design rule.

18. The method of claim 17, further comprising:
 executing a signal integrity analysis for the selected signal interconnection using the obtained detailed interconnection route and determining whether predetermined specifications of a product are satisfied;
 relaxing an evaluation condition, finding a further approximate interconnection route for each approximate position of the vias, evaluating interconnectivity of the found interconnection route, and obtaining the detailed interconnection based on evaluation result of the interconnectivity are repeated, until predetermined conditions of interconnection are satisfied.

* * * * *